United States Patent
Suzuki et al.

(10) Patent No.: US 6,514,855 B1
(45) Date of Patent: Feb. 4, 2003

(54) SEMICONDUCTOR DEVICE MANUFACTURING METHOD HAVING A POROUS INSULATING FILM

(75) Inventors: Tomomi Suzuki, Tokyo (JP); Hiroshi Ikakura, Tokyo (JP); Kazuo Maeda, Tokyo (JP); Yoshimi Shioya, Tokyo (JP); Koichi Ohira, Tokyo (JP)

(73) Assignees: Canon Sales Co., Inc. (JP); Semiconductor Process Laboratory Co., Ltd. (JP)

( * ) Notice: Subject to any disclaimer, the term of this patent is extended or adjusted under 35 U.S.C. 154(b) by 0 days.

(21) Appl. No.: 09/547,852

(22) Filed: Apr. 12, 2000

(30) Foreign Application Priority Data

Feb. 7, 2000 (JP) .......................... 2000-029387

(51) Int. Cl.[7] .......................................... H01L 21/4763
(52) U.S. Cl. ..................... 438/637; 438/763; 438/783
(58) Field of Search ..................... 438/618, 623–629, 438/637–640, 786–791, 795, 761–763, 783

(56) References Cited

U.S. PATENT DOCUMENTS 5,472,913 A * 12/1995 Havemann et al. ......... 438/624

FOREIGN PATENT DOCUMENTS

| JP | 24973 | 1/1990 |
|---|---|---|
| JP | 4139825 | 5/1992 |
| JP | 4-309228 | 10/1992 |
| JP | 690247 | 3/1994 |
| JP | 6168930 | 6/1994 |
| JP | 6349831 | 12/1994 |
| JP | 8-64680 | 3/1996 |
| JP | 897208 | 4/1996 |
| JP | 10189733 | 7/1998 |
| JP | 10-229083 | 8/1998 |
| JP | 10256363 | 9/1998 |
| JP | 118239 | 1/1999 |
| JP | 1197533 | 4/1999 |
| JP | 11288931 | 10/1999 |
| JP | 2001-298023 | 10/2001 |

* cited by examiner

Primary Examiner—Jey Tsai
(74) Attorney, Agent, or Firm—Lorusso & Loud

(57) ABSTRACT

The present invention relates to a semiconductor device manufacturing method for forming a via hole or a contact hole in an interlayer insulating film with a low dielectric constant. The method includes the steps of forming a nitrogen containing insulating film on a substrate, forming a porous insulating film on the nitrogen-containing insulating film, forming an opening in the underlying insulating film and the porous insulating film, and forming a nitrogen containing insulating film on the surface of the porous insulating film and on the surface of the opening by bringing these surfaces into contact with a plasma of any one of an ammonia gas, a nitrogen gas, and an oxygen nitride gas.

20 Claims, 5 Drawing Sheets

FIG. 2C $O_2$ Plasma

SEMICONDUCTOR DEVICE MANUFACTURING METHOD HAVING A POROUS INSULATING FILM

BACKGROUND OF THE INVENTION

1. Field of the Invention

The present invention relates to a semiconductor device manufacturing method for forming a via hole or a contact hole in an interlayer insulating film with a low dielectric constant.

2. Description of the Prior Art

In recent years, because of the higher degree of integration and the higher density of the semiconductor integrated circuit device, an increase in the data transfer rate has become needed. Therefore, there is a trend in wiring material, changing from the conventional aluminum (Al) to copper (Cu) having low resistance. In addition, concerning the interlayer insulating film surrounding this wiring, a film with a low dielectric constant is now in demand, instead of the conventional $SiO_2$ film (dielectric constant 4.0). Such a low dielectric constant film is, for example, a porous $SiO_2$ film whose dielectric constant is less than 2.0.

However, since the porous $SiO_2$ film formed by the film forming method of the prior art has a porous structure, it absorbs moisture when it is left in the air and when it is subjected to washing after the film formation. As a result, its dielectric constant is increased.

In particular, if a contact hole or a via hole is formed, sometimes the moisture is absorbed at the side wall of the opening.

Further, there is another problem in that the moisture penetrates to the interlayer insulating film to cause corrosion of the underlying wiring layer.

SUMMARY OF THE INVENTION

It is an object of the present invention to provide a semiconductor device manufacturing method capable of preventing increase in the dielectric constant of the interlayer insulating film by suppressing the moisture absorption of the interlayer insulating film even when the interlayer insulating film with the low dielectric constant is first formed and then the via hole or the contact hole is formed in the interlayer insulating film.

In the semiconductor device manufacturing method according to the present invention, the interlayer insulating film is a multilayered structure with a porous insulating film formed on an underlying nitrogen containing insulating film, or on any one of a SiOC containing insulating film, a SiOCH containing insulating film, and a SiOCHN containing insulating film, and with an opening formed in the interlayer insulating film.

The porous insulating film is quite suitable for use as the interlayer insulating film because it has a low dielectric constant, whereas corrosion of the wiring is likely to occur if the porous insulating film is directly formed on the wiring, because it has a high moisture penetration. However, in the present invention, an underlying nitrogen containing insulating film, or any one of a SiOC containing insulating film, a SiOCH containing insulating film, and a SiOCHN containing insulating film are provided under the porous insulating film. Therefore, since penetration of moisture is suppressed by the underlying insulating film, the corrosion of the wiring, etc., can be prevented.

In addition, after the step of forming the opening in the porous insulating film, a nitrogen containing insulating film is formed on the surface of the porous insulating film and on the inner surface of the opening by bringing the exposed surface into contact with a plasma of any one of an ammonia gas, a nitrogen gas, and an oxygen nitride gas.

Accordingly, since the overall surface of the interlayer insulating film is covered with the nitrogen containing insulating film, the penetration of moisture into the interlayer insulating film can be further suppressed.

Also, after the step of forming the opening in the porous insulating film, the opening is exposed to a $C_xH_y$ gas plasma. Accordingly, since a cover insulating film in the form of a hydrocarbon layer containing $C_xH_y$, e.g., $CH_3$, is formed on the surface of the side wall of opening in the porous insulating film, improvement in the moisture resistance can be further improved.

DESCRIPTION OF THE PREFERRED EMBODIMENTS

Embodiments of the present invention will be explained with reference to the accompanying drawings hereinafter.

First Embodiment

FIGS. 1A to 1G are sectional views showing a semiconductor device manufacturing method according to a first embodiment of the present invention.

Figure 1A:
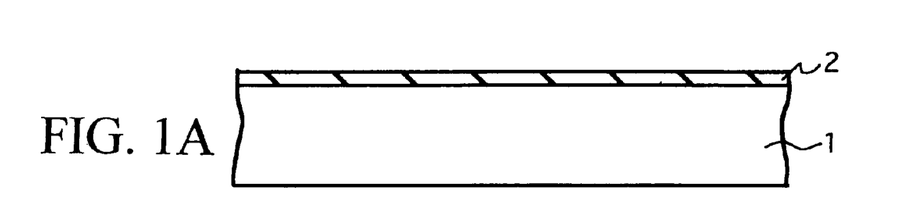
FIGS. 1A to 1G are sectional views showing a semiconductor device manufacturing method according to a first embodiment of the present invention.

To begin with, a silicon substrate 1 is loaded in a vacuum chamber, then the silicon substrate 1 is placed on a substrate holding table which is commonly used as a lower electrode of the parallel plate type, and then heated up to 300° C. While maintaining this temperature, $SiH_4$ at a flow rate of about 50 SCCM and $NH_3$ at a flow rate of about 250 SCGM are introduced to form a mixed gas and gas pressure in the chamber is set to 0.5 Torr.

Then, 100 W of power at a frequency of 400 kHz is applied to the lower electrode on which the silicon substrate 1 is held, and 50 W of power at a frequency of 13.56 MHz is applied to an upper electrode that opposes the lower electrode. Thus, the mixed gas of $SiH_4$ and $NH_3$ is plasmanized. While maintaining these conditions, as shown in FIG. 1A, an SiN film (nitrogen containing insulating film ) 2 is formed on the silicon substrate 1 by the plasma CVD method. The SiN film 2 is an insulating film which consists of only silicon (Si) and nitrogen (N).

A SiON film may be employed in lieu of the SiN 5 film 2. To form the SiON film, an $N_2O$ gas is added to the mixed gas of $SiH_4$ and $NH_3$. The flow rate of the $N_2O$ gas is set to 20 SCCM, for example, if the flow rate of the $SiH_4$ is set to about 50 SCCM and the flow rate of the $NH_3$ is set to about 250 SCCM.

Figure 1B:
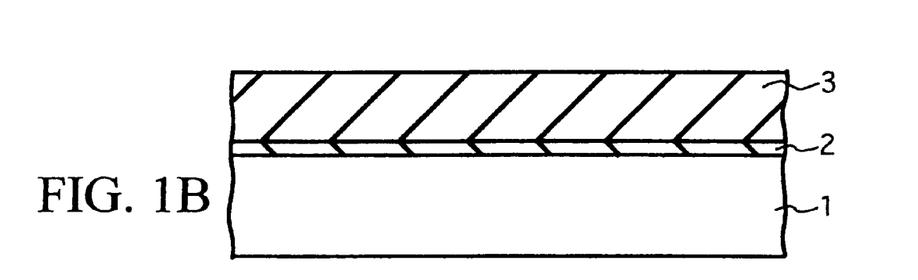

Then, while heating the silicon substrate 1 at 300° C. and introducing into the chamber $(CH_3)_3SiOSi(CH_3)_3$ at a flow rate of about 50 SCCM and $O_2$ at a flow rate of about 25 SCCM to form a mixed gas, with the gas pressure set at 2

Torr. Then, 100 W of power at a frequency of 400 kHz is applied to the lower electrode, and 50 W of power at a frequency of 13.56 MHz kHz is applied to the upper electrode. Thus, the mixed gas of $(CH_3)_3SiOSi(CH_3)_3$ and $O_2$ is plasmanized. While maintaining these conditions, as shown in FIG. 1B, a SiOCH film 3 of about 400 nm thickness is formed on the SIN film 2 by the plasma CVD method. The SiOCH film 3 is an insulating film which consists of only silicon (Si), oxygen (O), carbon (C), and hydrogen (H).

Then, with the silicon substrate 1 heated at 400° C., $O_2$ at a flow rate of about 25 SCCM is introduced into the chamber while the gas pressure is set to 0.4 Torr. Then, 100 W of power at a frequency of 400 kHz is applied to the lower electrode. Thus, the $O_2$ is plasmanized. Maintaining these conditions, the carbon in the SiOCH film 3 and the incoming oxygen react with each other to form voids in the SiOCH film 3. Hereinafter, the SiOCH film 3 having a number of voids is sometimes called a "porous SiOCH film."

Figure 1C:
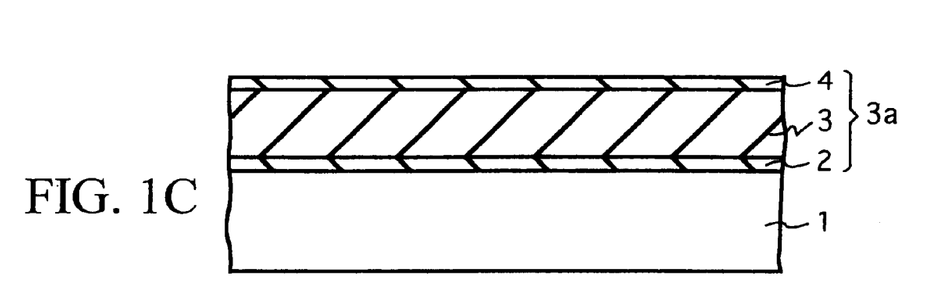

Then, with the silicon substrate 1 heated at 400° C., $NH_3$ at a flow rate of about 25 SCCM is introduced into the chamber while the gas pressure is set to 0.4 Torr. Then, 400 W of power at a frequency of 400 kHz is applied to the lower electrode. Hence, as shown in FIG. 1C, $NH_3$ is plasmanized. In this manner, a nitrogen containing insulating film (cover insulating film) 4 is formed on a surface of the SiOCH film 3. The SiN film 2, the SiOCH film 3, and the nitrogen containing insulating film 4 together constitute an interlayer insulating film 3a. Hereinafter, the interlayer insulating film containing the porous SiOCH film is sometimes called a "porous interlayer insulating film."

A photoresist film 5 is formed on the porous interlayer insulating film 3a, and then an opening 6 is formed in the photoresist film 5 in a region where a contact hole in the interlayer insulating film 3a is to be formed, by pattern etching the photoresist film 5.

Figure 1D:
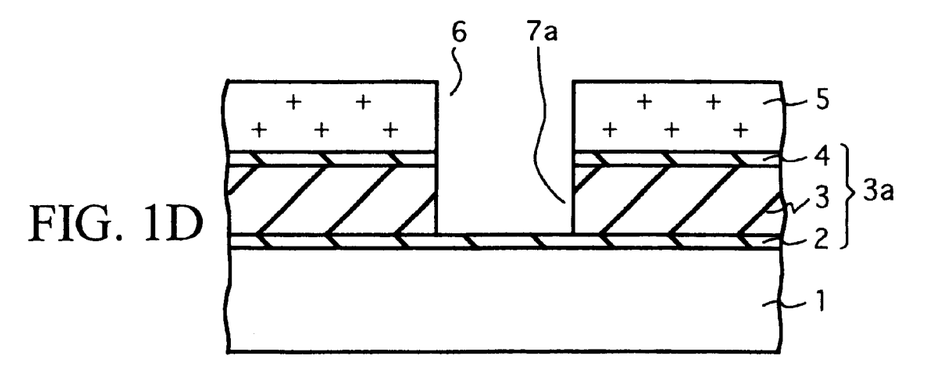

Then as shown in FIG. 1D, by the plasma etching method using a mixed gas of $CF_4$, $CHF_3$, and $O_2$, an opening 7a is formed in the nitrogen containing insulating film 4 and in the porous interlayer insulating film 3 via the opening 6 in the photoresist film 5.

Figure 1E:
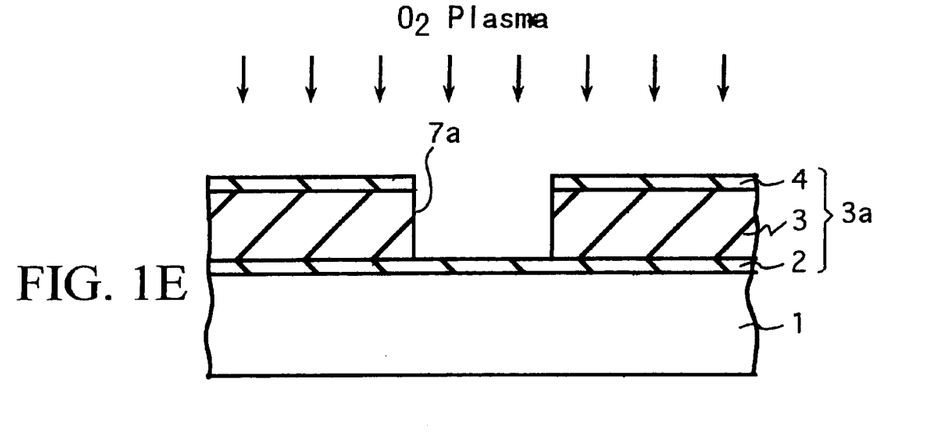

Then, as shown in FIG. 1E, the photoresist film 5 is removed by ashing using $O_2$, and then residue of the photoresist film 5 is chemically removed.

Figure 1F:
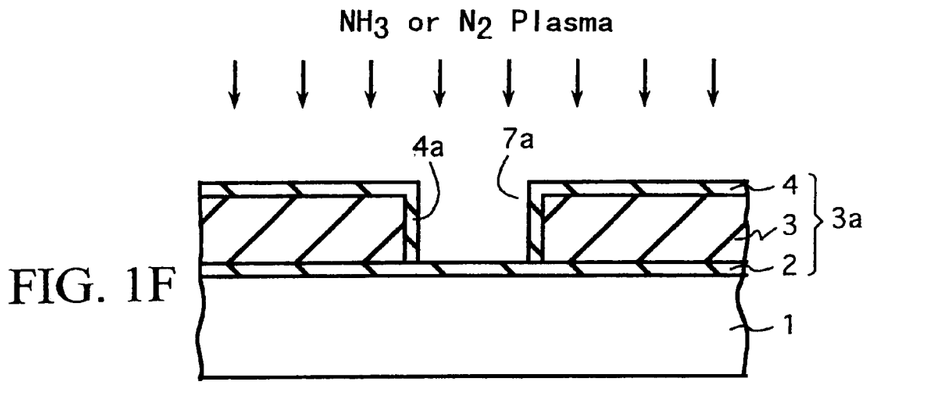

Then, as shown in FIG. 1F, $NH_3$ at a flow rate of about 400 SCCM is introduced into the chamber while the gas pressure is set to 0.2 Torr. Then, 300 W of power at a frequency of 400 kHz is applied to the lower electrode. Hence, $NH_3$ is plasmanized. While holding this condition, as shown in FIG. 1F, the nitrogen containing insulating films (cover insulating film) 4, 4a are respectively formed on the surface layer of the porous interlayer insulating film 3 and on the wall surface defining the opening 7a. The nitrogen containing insulating films 4, 4a may be formed under the same conditions by using $N_2$ in place of $NH_3$.

Figure 1G:
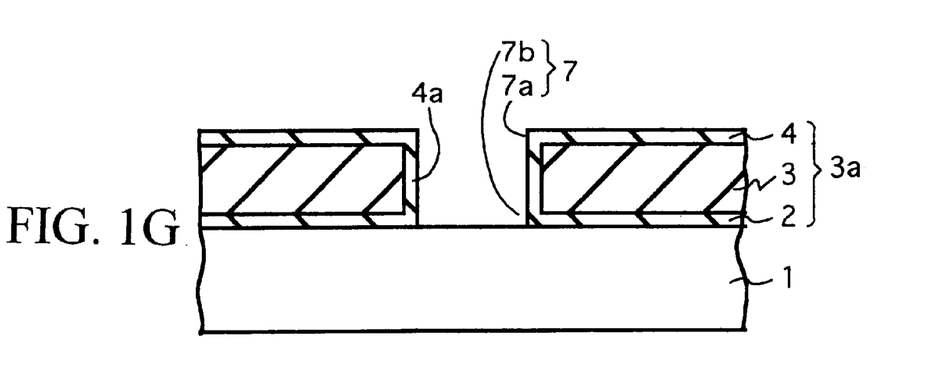

Then, as shown in FIG. 1G, the SiN film 2 exposed at the bottom of the opening 7a is removed by anisotropic etching using a mixed gas of $Cl_2$, $O_2$ and $CF_4$ to form an opening 7b. Thus, the silicon substrate 1 is exposed at the bottom of the new opening 7.

After this, a wiring metal film (not shown) is formed and then the upper wiring layer is formed by pattern etching the wiring metal film.

As described above, the first embodiment provides a porous interlayer insulating film 3a in which the porous SiOCH film 3 is sandwiched between the nitrogen containing insulating film 4 and the underlying insulating SiN film 2 with an opening 7.

Because the underlying insulating SiN film 2 is provided under the porous SiOCH film 3a, penetration of moisture into the lower area of the porous interlayer insulating film 3a can be prevented. Thus, for example, the corrosion of the lower wiring, etc., can be prevented.

Because SiN films 4, 4a are respectively formed on the surface of the porous interlayer insulating film 3a and on the side wall of the opening 7a, the penetration of moisture into the porous interlayer insulating film 3a is further suppressed.

As described above, since improvement of the moisture resistance of the porous interlayer insulating film 3a can be achieved, good contact resistance between the upper and lower wirings-electrodes, etc., can be obtained without the degradation of the low dielectric constant. As a result, the present invention is effective as a method of forming the contact hole in the porous interlayer insulating film 3a of a high-speed logic semiconductor integrated circuit, and has a remarkable effect of allowing a higher operational speed due to the lower dielectric constant of the interlayer insulating film.

Second Embodiment

FIGS. 2A to 2F are sectional views showing a semiconductor device manufacturing method according to a second embodiment of the present invention.

This second embodiment is different from the first embodiment in that a SiOCH film is employed as the underlying insulating film 12 in place of the SiN film and in that a hydrocarbon layer ("hydrocarbon containing insulating film" or "cover insulating film") 17 containing $C_xH_y$, e.g., $CH_3$, is formed on the surface layer of a porous interlayer insulating film 13 and on the wall surface of an opening 16a.

Figure 2A:
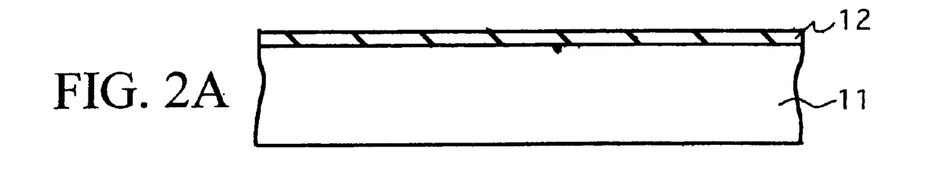
FIGS. 2A to 2F are sectional views showing a semiconductor device manufacturing method according to a second embodiment of the present invention.

In the manufacturing method of the second embodiment, a wafer 11 is first loaded into the pressure-reducible chamber, wherein it is placed on a substrate holding table which is commonly used as the lower electrode of the parallel plate type, and then heated up to 300° C. Assume that a silicon substrate is exposed at the surface of the wafer.

While maintaining this substrate heating temperature and introducing a mixed gas of $(CH_3)_3SiOSi(CH_3)_3$ at a flow rate of about 50 SCCM and $O_2$ at a flow rate of about 25 SCCM, the gas pressure is set to 2 Torr.

Then, 100 W of power at a frequency of 400 kHz is applied to the lower electrode, and 50 W of power at a frequency of 13.56 MHz is applied to the upper electrode that opposes the lower electrode. Thus, $(CH_3)_3SiOSi(CH_3)_3$ and $O_2$ are plasmanized. While maintaining these conditions, as shown in FIG. 2A, an SiOCH film 12 about 20 nm in thickness is formed on the wafer 11 by the plasma CVD method. The SiOCH film 12 is an insulating film which contains only silicon (Si), oxygen (O), carbon (C), and hydrogen (H).

Figure 2B:
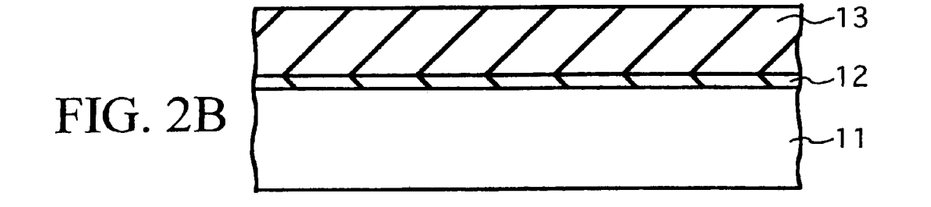

Then, while heating the wafer 11 at a temperature 300° C. and introducing into the chamber $(CH_3)_3SiOSi(CH_3)_3$ at a flow rate of about 50 SCCM and $O_2$ at a flow rate of about 25 SCCM, the gas pressure is set to 2 Torr. Then, 100 W of power at a frequency of 400 kHz is applied to the lower electrode, and 50 W of power at a frequency of 13.56 MHz kHz is applied to the upper electrode which faces the lower electrode. As a result, the mixed gas of $(CH_3)_3SiOSi(CH_3)_3$ and $O_2$ is plasmanized. While maintaining these conditions, as shown in FIG. 2B, the SiOCH film 13 of about 400 nm in thickness is formed on the SiOCH film 12 by the plasma CVD method.

Figure 2C:
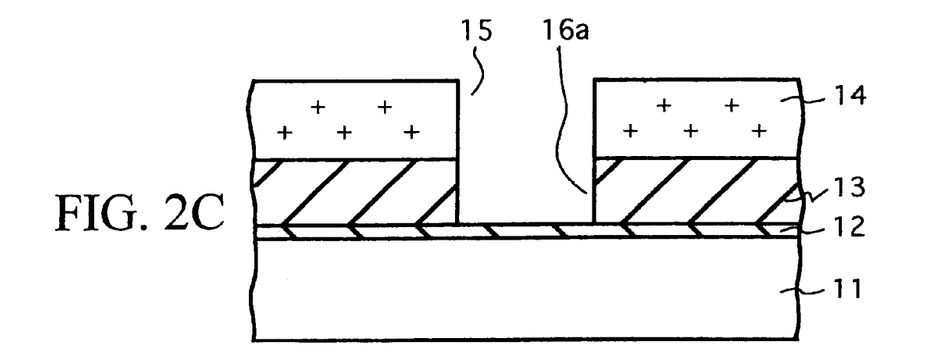

Then, a photoresist film 14 is formed on the SiOCH film 13 and an opening 15 is formed in the photoresist film 14 in a region where a contact hole of the SiOCH film 13 is to be formed, by pattern etching the photoresist film 14. Then, as shown in FIG. 2C, an opening 16a is formed in the SiOCH film 13 via the opening 15 in the photoresist film 14 by the plasma etching method using a mixed gas of $CF_4$, $CHF_3$, and $O_2$.

The photoresist film 14 is removed by ashing using $O_2$, and then residue of the photoresist film 14 is chemically removed.

Figure 2D:
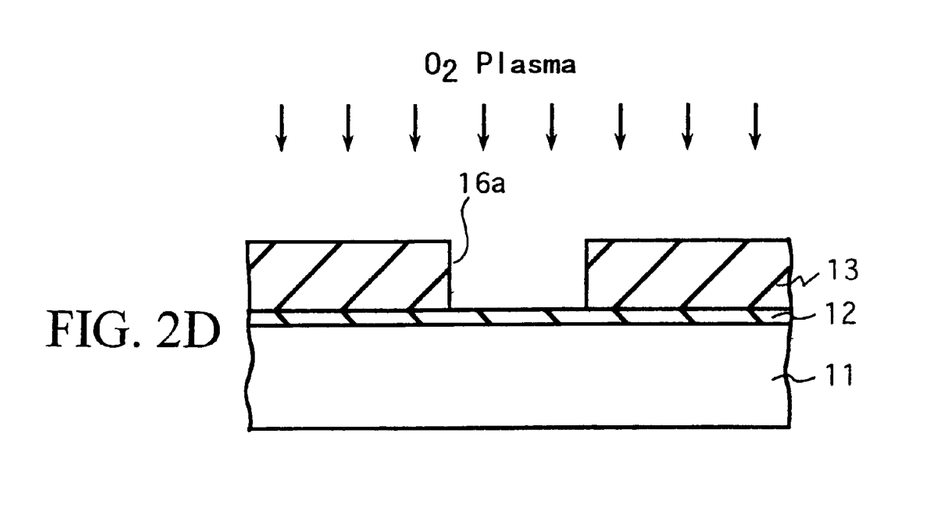

Then, while heating the wafer 11 at 400° C. and introducing $O_2$ at a flow rate of about 25 SCCM, the gas pressure is set to 0.4 Torr. Then, 400 W of power at a frequency of 400 kHz is applied to the lower electrode. Hence, $O_2$ is plasmanized. As shown in FIG. 2D, if this condition is held, the carbon in the SiOCH film 13 and the incoming oxygen react with each other to remove the carbon, whereby voids are formed in the film to produce the porous SiOCH film 13.

Figure 2E:
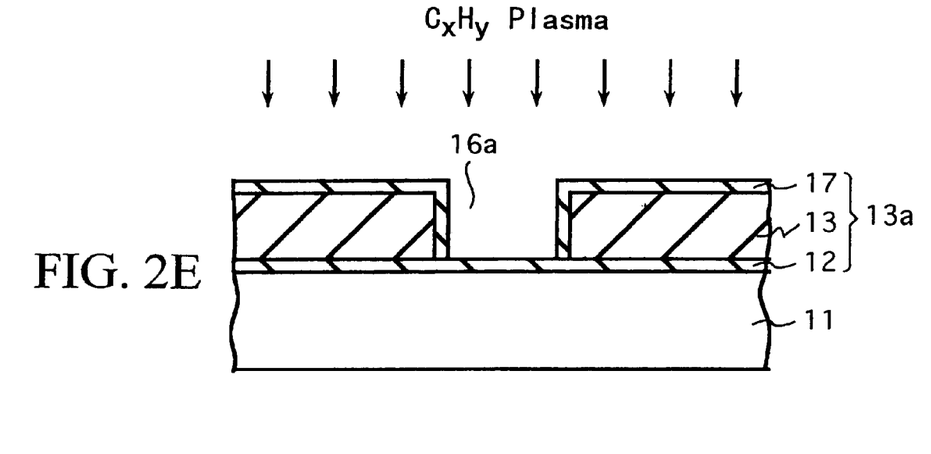

Then, as shown in FIG. 2E, the wafer 11 is heated at 400° C., and $C_xH_y$ at a flow rate of about 100 SCCM is introduced into the chamber while the gas pressure is set to about 0.4 Torr. Then, 400 W of power at a frequency of 400 kHz is applied to the lower electrode to plasmanize the $C_xH_y$. While maintaining these conditions, as shown in FIG. 2E, a hydrocarbon layer (cover insulating film) 17 containing $C_xH_y$ is formed on the porous SiOCH film and on the wall of the opening 16a. The SiOCH film 12, the porous SiOCH film 13, and the hydrocarbon film 17 together constitute a porous interlayer insulating film 13a.

Figure 2F:
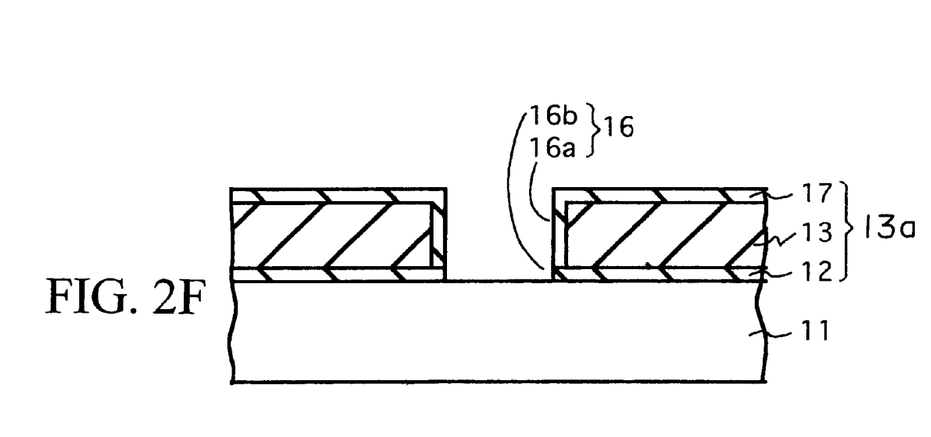

Then, as shown in FIG. 2F, the SiOCH film 12 exposed at the bottom of the opening 16a is removed by anisotropic etching using a mixed gas of $CF_4$, $CHF_3$, and $O_2$ to form an opening portion 16b and to expose the silicon substrate 11 at the bottom of the new opening 16.

After this, a wiring metal film (not shown) is formed and then an upper wiring layer is formed by pattern etching of the wiring metal film.

As mentioned above, in the semiconductor device manufacturing method according to the present invention, the porous SiOCH film 13 is formed on the underlying SiOCH insulating film 12, and then the opening 16a is formed in the porous SiOCH film 13.

Since the penetration of moisture into the lower layer is suppressed by the underlying insulating film 12, adherence of the contaminants on the silicon substrate, the corrosion of the electrode on the surface of the silicon substrate, etc. can be prevented.

Further, the hydrocarbon layer 17 containing $C_xH_y$ formed on the surface of the porous SiOCH film 13 and on the wall of the opening 16a, provides an additional improvement in the moisture resistance.

In this case, as in the first embodiment, because of the improvement in the moisture resistance of the porous interlayer insulating film 13a, good contact resistance between the upper and lower wirings; electrodes, etc., can be obtained without degradation of the low dielectric constant. As a result, the present invention is effective as a method of forming a contact hole in the porous interlayer insulating film 3a in the high-speed logic semiconductor integrated circuit, and has the remarkable effect of allowing higher operational speed due to the lower dielectric constant of the interlayer insulating film.

Third Embodiment

Figure 3:
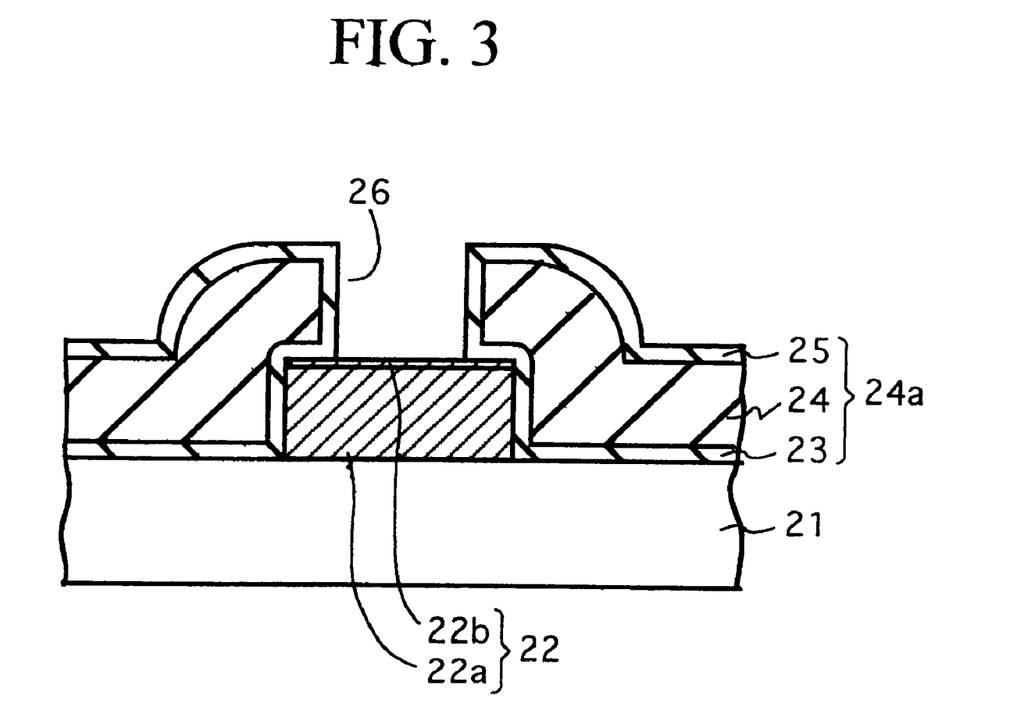
FIG. 3 is a sectional view showing a semiconductor device manufacturing method according to a third embodiment of the present invention.

FIG. 3 is a sectional view showing a semiconductor device manufacturing method according to a third embodiment of the present invention.

This third embodiment differs from the first and second embodiments in that a lower wiring (the conductive substrate) 22, consisting of an Al film 22a and a Ti film 22b on the Al film 22a, is formed on a lower insulating film 21 which, in turn, is formed on the silicon substrate of the wafer.

FIG. 3 shows a section of a porous interlayer insulating film 24a and an opening 26 exposing the lower wiring 22 formed in accordance with the present invention. In FIG. 3, 23 denotes an underlying insulating film formed of the same material as in the first or second embodiment; 24, a porous insulating film formed of the same material as that in the first or second embodiment; and 25, a cover insulating film formed of the same material as that in the first or second embodiment.

In the case of the third embodiment, because the penetration of moisture into the porous interlayer insulating film 24a is suppressed by the underlying insulating film 23 and the cover insulating film 25, the corrosion of the lower wiring 22 can be prevented.

In this third embodiment, as in the first embodiment, because of the improvement in the moisture resistance of the porous interlayer insulating film 24a good contact resistance between the upper and lower wiring layers can be obtained without degradation of the low dielectric constant. As a result, the present invention is effective as a method of forming a contact hole in the interlayer insulating film 24a for a high-speed logic semiconductor integrated circuit, and has the remarkable effect of allowing higher operational speed due to the lower dielectric constant of the interlayer insulating film 24a.

Although the present invention has been explained in detail with reference to the foregoing embodiments, the scope of the present invention is not restricted to the above embodiments. Various modifications of the above embodiments are intended to be included in the scope of the present invention. For example, while the described embodiments have SiN film 2 under the porous SiOCH film 3 in the first embodiment, another insulating film, such as a SiON film or a SiOCH film, may be provided. Further, while SiOCH film 12 is provided under the porous SiOCH film 13 in the second embodiment, another insulating film such as a SiN film or a SiON film may be used for this purpose. In addition, in the first and second embodiments, the underlying insulating film may be an SiOC film or an SiOCHN film in lieu of that described. Here, "SiOC film" means an insulating film containing only Si, O, C, and H, and "SiOCHN film" means an insulating film containing only Si, O, C, H, and N. The SiOC film can be formed by the plasma CVD method using $(CH_3)_3SiOSi(CH_3)_3$ at a flow rate of 50 SCCM and at a pressure of 1 Torr, with 200 W of power at a frequency of 400 kHz applied to the lower electrode. The SiOCHN film can be formed by the plasma CVD method using a gas containing a very small amount of $N_2O$ added to the SiOCH film forming gas, i.e., the mixed gas of $(CH_3)_3SiOSi(CH_3)_3$ and $O_2$.

In addition, in the first embodiment, after the step of forming the opening 7a in the porous interlayer insulating film 3a, the nitrogen containing insulating films 4, 4a are formed on the surface of the porous interlayer insulating film 3a and on the side wall of the opening 7a, respectively, by bringing the exposed surfaces into contact with the ammonia gas plasma. However, these exposed surfaces may be brought into contact with a plasma of a nitrogen gas or an oxygen dinitride gas in place of the ammonia gas.

Also, as shown in FIG. 1E, after the resist film 5 has been removed, the wall defining the opening 7a is brought into contact with the plasma of a nitrogen containing gas such as ammonia gas, etc. However, alternatively, the wall of the opening 7a may be brought into contact with a plasma of a nitrogen containing gas such as ammonia gas, etc., while leaving the resist film 5 as is. The processing conditions may be similar to the case wherein the resist film is removed.

Although the porous insulating film 3 has already been covered with the nitrogen containing insulating film 4 before the exposed surface is brought into contact with the plasma of ammonia gas, the nitrogen containing insulating film 4 need not be formed before contact with the ammonia gas plasma. In this case, the surface of the porous insulating film 3 is brought into direct contact with the ammonia gas plasma to form the nitrogen containing insulating film 4 on the surface of the porous insulating film 3 while forming the nitrogen containing insulating film 4a on the wall surface of the opening 7a.

Also, in the above embodiments, while a porous SiOCH film is employed as the porous insulating films 3, 13, 24, alternatively, a porous SiOC film or a porous SiOCHN film may be employed.

As mentioned above, since an improvement in the moisture resistance of the porous interlayer insulating film is achieved, good contact resistance between the upper and lower wiring layers can be obtained without the degradation of the low dielectric constant. As a result, the present invention is effective as the method of forming a contact hole in an interlayer insulating film for a high-speed logic semiconductor integrated circuit, and has the remarkable effect of allowing for higher operational speed due to the lower dielectric constant of the interlayer insulating film.

What is claimed is:

1. A semiconductor device manufacturing method comprising the steps of:
    forming, as an underlying insulating film, one of an SiOC containing insulating film, an SiOCH containing insulating film, and an SiOCHN containing insulating film, on a conductive substrate;
    forming a porous insulating film on the underlying insulating film; and
    forming an opening in an interlayer insulating film which includes the underlying insulating film and the porous insulating film.

2. A semiconductor device manufacturing method according to claim 1, wherein the interlayer insulating film additionally includes one of a nitrogen containing insulating film and a hydrocarbon containing insulating film formed on the porous insulating film.

3. A semiconductor device manufacturing method according to claim 1, wherein the step of forming the opening in the interlayer insulating film comprises the steps of:
    forming a nitrogen containing insulating film on a surface of the porous insulating film;
    forming an opening in the nitrogen containing insulating film and the porous insulating film; and
    forming a nitrogen containing insulating film on a surface of the porous insulating film and on a wall surface of the opening by contacting the surface of the nitrogen containing insulating film and the wall surface of the opening with a plasma of one of an ammonia gas, a nitrogen gas, and an oxygen nitride gas.

4. A semiconductor device manufacturing method according to claim 3, further comprising the step of:
    after the step of forming the nitrogen containing insulating film, forming an opening in the underlying insulating film to expose the substrate.

5. A semiconductor device manufacturing method according to claim 1, wherein the step of forming the opening in an interlayer insulating film comprises:
    forming an opening in the porous insulating film; and
    forming a hydrocarbon containing insulating film on a surface of the porous insulating film and on a wall surface of the opening by contacting the surface of the porous insulating film and the wall surface of the opening with a $C_xH_y$ gas plasma.

6. A semiconductor device manufacturing method according to claim 5, further comprising the step of:
    after the step of contacting with the $C_xH_y$ gas plasma, removing the $C_xH_y$ remaining in the opening by using an $O_2$ plasma or an $O_2+CF_4$ gas plasma.

7. A semiconductor device manufacturing method according to claim 6, further comprising the step of:
    after the step of removing the $C_xH_y$, forming an opening in the underlying insulating film to expose the substrate.

8. A semiconductor device manufacturing method according to claim 1, wherein the conductive substrate is a metal wiring.

9. A semiconductor device manufacturing method, comprising the steps of:
    forming a nitrogen containing insulating film, as an underlying insulating film, on a substrate;
    forming a silicon containing insulating film on a surface of the underlying insulating film to provide an interlayer insulating film that includes the underlying insulating film and the silicon containing insulating film;
    etching the silicon containing insulating film to form an opening extending to and exposing the underlying insulating film;
    contacting the silicon containing insulating film with an oxygen gas plasma to thus transform the silicon containing insulting film into a porous insulating film;
    contacting a surface of the interlayer insulating film and a wall surface of the opening with a plasma of one of an ammonia gas, a nitrogen gas, and an oxygen nitride gas to thus form a first nitrogen containing insulating film as a surface layer at least on the wall surface of the opening; and
    etching the underlying insulating film via the opening to expose the substrate at a bottom portion of the opening.

10. A semiconductor device manufacturing method according to claim 9, wherein the step of forming the opening is before the step of contacting the silicon containing insulating film with an oxygen gas plasma to thus transform the silicon containing insulating film into the porous insulating film.

11. A semiconductor device manufacturing method according to claim 9, wherein the step of forming the opening is after the step of contacting the silicon containing insulating film with an oxygen gas plasma to thus transform the silicon containing insulating film into the porous insulating film.

12. A semiconductor device manufacturing method according to claim 9, further comprising the step of:
    prior to the step of forming the first nitrogen containing insulating film, forming a second nitrogen containing insulating film on the porous insulating film whereby the interlayer insulating film includes the underlying insulating film, the porous insulating film, and the second nitrogen containing insulating film.

13. A semiconductor device manufacturing method according to claim 9, further comprising the step of:

prior to the step of forming the first nitrogen containing insulating film, forming a hydrocarbon containing insulating film on the porous insulating film, whereby the interlayer insulating film includes the underlying insulating film, the porous insulating film, and the hydrocarbon containing insulating film.

14. A semiconductor device manufacturing method according to claim 9 wherein, in the step of forming the first nitrogen containing insulating film, the interlayer insulating film has a two layer structure composed of the underlying insulating film and the porous insulating film, and the first nitrogen containing insulating film is formed on the surface of the porous insulating film inside and outside the opening.

15. A semiconductor device manufacturing method according to claim 9, wherein the surface of the substrate on which the underlying insulating film is formed has exposed metal wiring.

16. A semiconductor device manufacturing method, comprising the steps of:

forming a nitrogen containing insulating film, as an underlying insulating film, on a surface of a substrate;

forming a silicon containing insulating film on the underlying insulating film to provide an interlayer insulating film that includes the underlying insulating film and the silicon containing insulating film;

etching the silicon containing insulating film to form an opening extending to and exposing the underlying insulating film;

contacting the silicon containing insulating film with an oxygen gas plasma to thus transform the silicon containing insulating film into a porous insulting film;

contacting a surface of the porous insulting film inside and outside the opening with a $C_xH_y$ gas plasma to thus form a hydrocarbon insulating film on the surface of the porous insulating film inside and outside the opening; and etching the underlying insulating film via the opening to expose the substrate at a bottom portion of the opening.

17. A semiconductor device manufacturing method according to claim 16, wherein the step of etching to form the opening is before the step of contacting the silicon containing insulating film with an oxygen gas plasma and transforming the silicon containing insulating film into the porous insulating film.

18. A semiconductor device manufacturing method according to claim 16, wherein the step of etching to form the opening is after the step of contacting the silicon containing insulating film with an oxygen gas plasma and transforming the silicon containing insulating film into the porous insulating film.

19. A semiconductor device manufacturing method according to claim 16, further comprising the step of:

contacting the surface of the porous insulating film, including at least the wall surface of the opening, to an $O_2$ gas plasma or to an $O_2+CF_4$ gas plasma after the step of contacting with the $C_xH_y$ gas plasma.

20. A semiconductor device manufacturing method according to claim 16, wherein the surface of the substrate on which the underlying insulating film is formed has exposed metal wiring.

* * * * *